(12) United States Patent
Jarrar et al.

(10) Patent No.: US 9,425,775 B2
(45) Date of Patent: Aug. 23, 2016

(54) LOW SWING FLIP-FLOP WITH REDUCED LEAKAGE SLAVE LATCH

(71) Applicants: Anis M. Jarrar, Austin, TX (US); John M. Dalbey, Austin, TX (US); Alexander B. Hoefler, Austin, TX (US); Colin MacDonald, Austin, TX (US)

(72) Inventors: Anis M. Jarrar, Austin, TX (US); John M. Dalbey, Austin, TX (US); Alexander B. Hoefler, Austin, TX (US); Colin MacDonald, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 14/481,269

(22) Filed: Sep. 9, 2014

(65) Prior Publication Data

US 2016/0072484 A1    Mar. 10, 2016

(51) Int. Cl.
*H03K 3/289* (2006.01)
*H03K 3/3562* (2006.01)
*H03K 3/037* (2006.01)

(52) U.S. Cl.
CPC .......... *H03K 3/35625* (2013.01); *H03K 3/0372* (2013.01)

(58) Field of Classification Search
CPC .................. H03K 3/35625; H03K 3/0372
USPC ........................................................ 327/202
See application file for complete search history.

(56) References Cited

U.S. PATENT DOCUMENTS

| | | |
|---|---|---|
| 7,164,301 B2 | 1/2007 | Chun |
| 7,583,121 B2 | 9/2009 | Berzins et al. |
| 7,768,331 B1 | 8/2010 | Biyani |
| 8,471,618 B2 | 6/2013 | Chien et al. |
| 2010/0148836 A1 | 6/2010 | Zlatanovici |

*Primary Examiner* — Ryan Jager (57) ABSTRACT

A data processing system includes first and second power distribution networks to provide power at first and second voltages, and a flip-flop. The second voltage is less than the first voltage. The flip-flop includes a master latch with a power node connected to the first power distribution network, a data signal input, and an output signal output that is driven at the first voltage, and a slave latch with a power node connected to the first power distribution network, an input coupled to the output of the master latch, a slave latch output signal output that is driven by the first voltage, and a feedback circuit with a first latch inverter having a power node connected to the second voltage, an input coupled to the master latch output, and an output terminal to provide an output signal that is driven by the second voltage.

20 Claims, 7 Drawing Sheets

LOW SWING FLIP-FLOP WITH REDUCED LEAKAGE SLAVE LATCH

FIELD OF THE DISCLOSURE

This disclosure generally relates to data processing and more particularly to flip-flops in a data processing system.

BACKGROUND

A system-on-a-chip (SoC) device is an integrated circuit that integrates various electronic components of a computer system onto a single die. Therefor, a SoC device may provide comparable computing capabilities as a system that uses multiple components, while consuming less power than the comparable computer system design by virtue of its integrated nature.

One type of SoC device can include functional logic and a clock tree that operate based upon a power grid having a single distribution network (power grid) that provides both the functional logic and the clock tree with power, e.g., the power grid can operate to provide a single voltage level (a main voltage level) to the functional logic and clock tree. Another type of SoC device uses a low swing clock (LSC) tree to achieve lower dynamic and static power consumption in the SoC design. A SoC device that includes a LSC tree operates to provide certain portions of the functional logic and the clock tree with power from a first power distribution network at a first voltage level (the main voltage level), to provide other portions of the functional logic and the clock tree with power from a second power distribution network at a second, typically lower, voltage level, and to provide yet other portions of the functional logic and the clock tree with power from both the first and second power distribution networks. The clock tree of an SoC device can account for 40-50% of the power of the SoC device. A clock tree that provides clock signals having lower voltage swings consumes less dynamic and static power than a clock tree that provides clock signals with a higher voltage swing, and can be referred to as a LSC tree.

BRIEF DESCRIPTION OF THE DRAWINGS

The present disclosure may be better understood, and its numerous features and advantages made apparent to those skilled in the art by referencing the accompanying drawings, wherein.

The use of the same reference symbols in different drawings indicates similar or identical items.

DETAILED DESCRIPTION OF THE DRAWINGS

According to an embodiment of the present disclosure, an SoC device can include a power grid having a plurality of distribution networks that provides multiple voltage levels: a high voltage level; a low voltage level; and a reference/ground voltage level. The SoC device can include a low-swing clock (LSC) tree, a flip-flop, and logic circuitry (functional circuitry). The LSC tree can provide a LSC signal that swings between the low voltage level and ground. The flip-flop receives the LSC signal, and in response latches bits of data received at an input, and provides the latched data to the logic circuitry. Typically, the latched data of the flip-flop swings between the high voltage level and ground. The flip-flop may have a single-bit or a multi-bit implementation.

According to another embodiment of the present disclosure, a flip-flop can include a master latch and a slave latch. The circuit path of the flip-flop from the clock input of the master latch to the output of the slave latch, which can be referred to as A clock-to-Q path, can be implemented with inverters that are powered from a high voltage level, while inverters in a serial loop-back path of the slave latch, e.g., the circuit path that forms the latch of the slave latch, can be implemented with inverters that are powered from the low voltage level. Thus the serial loop-back inverters of the slave latch can consume less dynamic and static power, than would be the case if the serial loop-back inverter were powered from the high voltage level. The slave latch can include a pass gate in the place of a transmission gate, thereby reducing the number of transistors in the serial loop-back circuit by one transistor, and can add a pull-up transistor to pull the output of the serial loop-back latch circuit to the high voltage level. As such, the slave latch of the present disclosure can be implemented to reduce the power consumed by the slave latch, while retaining a similar layout footprint to a similar slave latch where the serial loopback latch inverters are powered by the high voltage level. In another embodiment, an inverter in the master latch can be powered from the low voltage level, thereby reducing the power consumed by the master latch.

In a particular embodiment of the present disclosure, the layout of the flip-flop can be implemented such that all the inverters that are powered from the high voltage level can include transistors that are instantiated in a first n-well and such that all the inverters that are powered from the low voltage level can include transistors that are instantiated in a second n-well. Here, the first n-well can be tied to the high voltage power source, and the second n-well can be tied to the low voltage power source. In another embodiment, the layout of the flip-flop can be implemented such that all the inverters, both those that are powered from the high voltage level and those that are powered from the low voltage level, can include transistors that are instantiated in a common n-well to help reduce the area needed to n-well isolation. Here, the common n-well can be tied to the high voltage power source, thereby further reducing the leakage in the low voltage level inverters.

Figure 1:
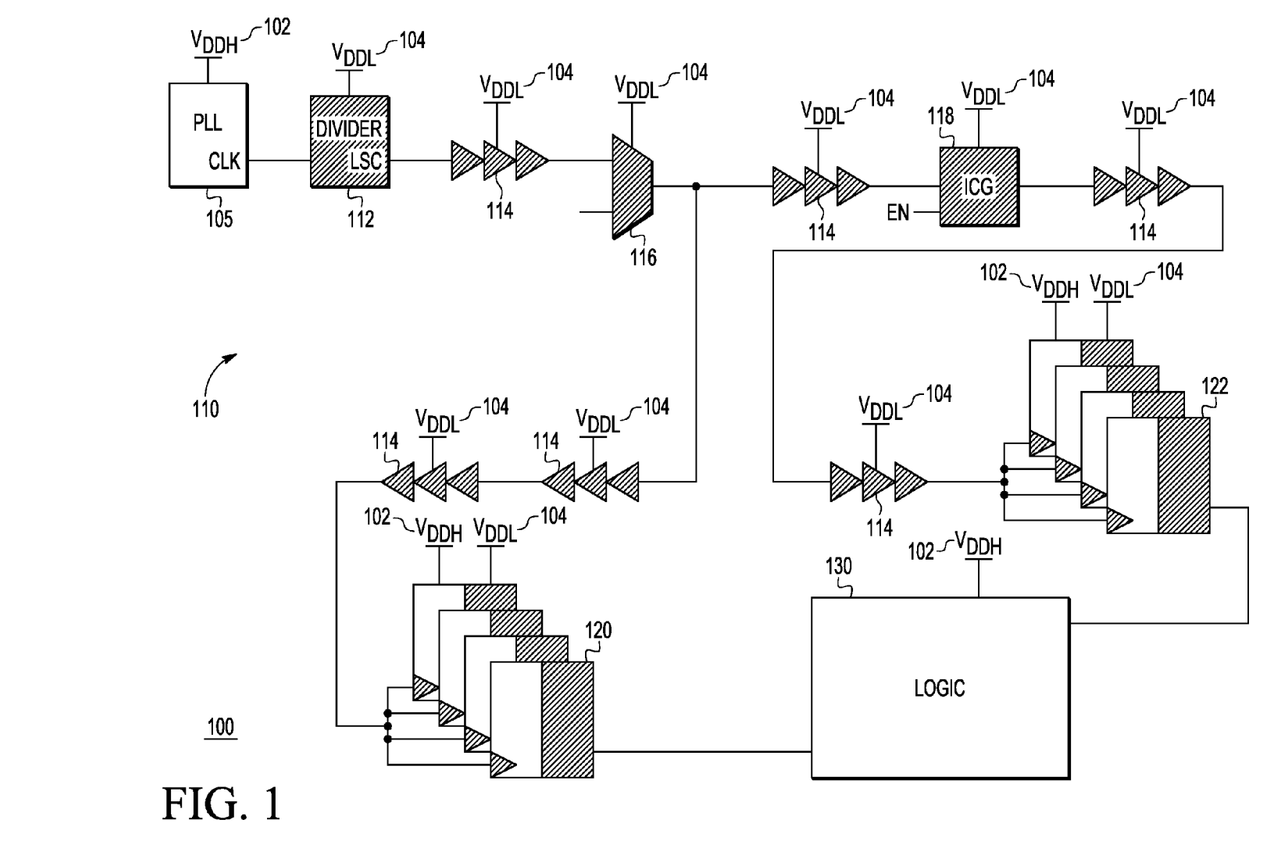
FIG. 1 illustrates a system-on-a-chip (SoC) device, according to an embodiment of the present disclosure.

FIG. 1 illustrates a SoC device 100, according to an embodiment of the present disclosure. A power grid of SoC device 100 provides multiple voltage levels: a high voltage level (VDDH) 102; a low voltage level (VDDL) 104; and a reference voltage level (presumed herein to be ground). As an example, a high voltage level power distribution network can provide voltage VDDH 102 of 1.1 Volts (V), and a low voltage level power distribution network can provide voltage VDDL 104 of 0.7 V. SoC device 100 includes a phase-locked loop (PLL) 105, a low-swing clock (LSC) tree 110, multi-bit flip-flops 120 and 122, and logic circuitry 130 (functional circuitry). LSC tree 110 includes a clock divider 112, clock buffers 114, a clock multiplexer 116, and an integrated clock gate (ICG) 118.

Logic circuitry 130 operates to implement the functional features of SoC device 100, such as to receive input data, to perform data processing operations on the input data, and to provide output data. PLL 105 includes a clock signal (CLK) output that provides a clock signal, referred to as the CLK signal, having a time-base for clocking various components of SoC device 100, such as various portions of logic circuitry 130. PLL 105 receives power from the high voltage power distribution network, and thus the CLK signal swings between VDDH 102 and ground. In another embodiment, PLL 105 operates at a lower voltage level (VDDL).

Clock divider 112 receives the CLK signal and includes a low swing clock (LSC) output that provides a clock signal, referred to as the LSC signal, that has a frequency that is a predetermined fraction of the frequency of the CLK signal. Clock divider 112 receives power from the low voltage power distribution network, and thus the LSC signal swings between VDDL 104 and ground. The LSC signal is provided to clock buffer 114 that operates to buffer the LSC signal to maintain signal integrity of the LSC signal across SoC device 100, and to avoid skewing of the LSC signal at timing-critical portions of the SoC device. Clock buffer 114 receives power from the low voltage power distribution network, and thus the LSC signal from the clock buffer swings between VDDL 104 and ground. Other clock buffers 114 are illustrated in FIG. 1, but will not be further described herein. For ease of discussion, the clock signals propagated in LSC tree 110 swing between VDDL 104 and ground, and are referred to as LSC signals, regardless of the number of times it has been buffered, divided or gated.

The LSC signal is received at an input of clock multiplexer 116. Clock multiplexer 116 includes one or more additional inputs that operate to receive other clock signals (not illustrated) of the SoC design. Clock multiplexer 116 operates to select one of the plurality of clock signals, including the LSC signal, and to provide the selected clock signal to a portion of LSC tree 110 for further propagation. Clock multiplexer 116 receives power from the low voltage power distribution network, and thus the selected clock signal (hereinafter assumed to be the LSC signal) swings between VDDL 104 and ground. The LSC signal from multiplexer 116 is provided to ICG 118 and to multi-bit flip-flop 120

Multi-bit flip-flop 120 receives the LSC signal, and operates to latch bits of data received on inputs of the flip-flops (not illustrated) and to provide the latched data to logic circuitry 130. Multi-bit flip-flop 120 receives power from the high voltage power distribution network and from the low voltage power distribution network. Typically, the latched data from multi-bit flip-flop 120 swings between VDDH 102 and ground. ICG 118 receives the LSC signal and, based upon an enable input signal (EN), selectively provides the LSC signal to multi-bit flip-flop 122. As such, ICG 118 can operate to gate the LSC signal to portions of LSC tree 110, allowing those portions to become static, thus effectively being turned off. Alternatively, if ICG 118 is enabled, the LSC signal is propagated, wherein multi-bit flip-flop 122 receives the LSC signal and operates similarly to multi-bit flip-flop 120, as described above. ICG 118 receives power from the low voltage power distribution network, and thus the LSC signal swings between VDDL 104 and ground. The skilled artisan will recognize that the other arrangements of components within a LSC tree may be made or that other components may be included in the LSC tree, as needed or desired.

Figure 2:
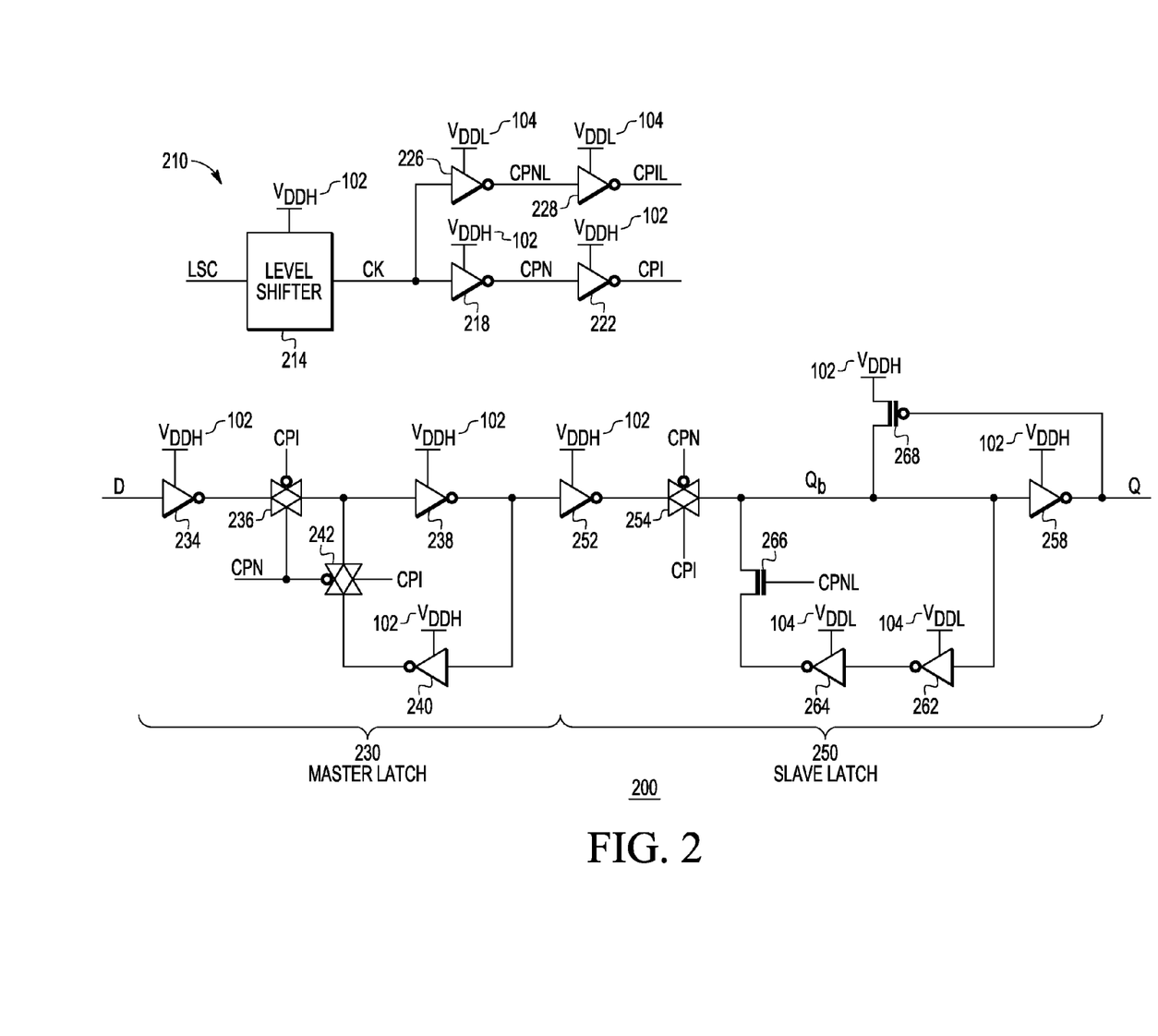
FIG. 2 illustrates a flip-flop, according to an embodiment of the present disclosure.

FIG. 2 illustrates a flip-flop 200, and a clock generator 210 that provides specific clock signals to the flip-flop, according to an embodiment of the present disclosure. Flip-flop 200 represents a single-bit flip flop similar to the individual flip-flops of multi-bit flip-flops 120 and 122, as shown in FIG. 1, and includes a master latch 230 and a slave latch 250. Clock generator 210 includes a level shifter 214 and inverters 218, 222, 226 and 228. Clock generator 210 operates to receive a LSC signal from a LSC tree, such as LSC tree 110, as shown in FIG. 1, at a LSC input of level shifter 214. Level shifter 214 operates to receive the LSC signal, to change the LSC signal into a high-swing clock (CK) signal, and to provide the CK signal to an inverter 218 and to an inverter 226. Level shifter 214 receives power from the high voltage power distribution network, as shown in FIG. 1, and thus the CK signal swings between VDDH 102 and ground. Inverter 218 operates to invert the CK signal to provide a clock pin negated (CPN) signal. Inverter 218 receives power from the high voltage power distribution network, and thus the CPN signal swings between VDDH 102 and ground. The CPN signal is provided to another inverter 222 which operates to invert the CPN signal to provide a clock pin internal (CPI) signal. Inverter 222 receives power from the high voltage power distribution network, and thus the CPI signal swings between VDDH 102 and ground.

Inverter 226 operates to invert the CK signal to provide a clock pin negated-low (CPNL) signal. Inverter 226 receives power from the low voltage power distribution network, as shown in FIG. 1, and thus the CPNL signal swings between VDDL 104 and ground. The CPNL signal is provided to another inverter 228 which operates to invert the CPNL signal to provide a clock pin internal-low (CPIL) signal. Inverter 228 receives power from the low voltage power distribution network, and thus the CPIL signal swings between VDDL 104 and ground. In a particular embodiment, local clock generator 210 operates to provide the clock signals (CPN signal, CPI signal, and CPNL signal) to master latch 230 and to slave latch 250, as described below. In another embodiment, not illustrated, local clock generator 210 operates to provide the clock signals to two or more flip-flop master latches similar to master latch 230 and to two or more associated flip-flop slave latches similar to slave latch 250. For example, a multi-bit flip-flop similar to multi-bit flip-flop 120, as shown in FIG. 1, can include one common local clock generator similar to local clock generator 210. In a particular embodiment (not illustrated), inverter 226 receives the LSC signal directly, rather than receiving the CK signal. Here, the CPNL signal is provided without having passed through level shifter 214. This embodiment may provide a clock skew between the CPN signal and the CPNL signal, as needed or desired.

Master latch 230 operates to receive a data (D) signal from logic circuitry of a SoC device, such as logic circuitry 130, as shown in FIG. 1, and to latch the state of the D signal until such time as the D signal changes logic state, at which time the master latch latches to the new state. The D can include a high-swing signal that swings between VDDH 102 and ground, or a low-swing signal that swings between VDDL 104 and ground. In particular, the D signal is provided to an inverter 234 which inverts the D signal. The inverted D signal is provided to a transmission gate 236. Transmission gate 236 includes an n-MOS pass gate portion that is connected to the CPN signal, and a p-MOS pass gate portion that is connected to the CPI signal. Thus, when the CK signal is at a logic-high state, the CPN signal is at a logic-low state and the CPI signal is at a logic-high state, and transmission gate 236 is turned off, and when the CK signal is at a logic low state, the CPN signal is at the logic-high state and the CPI signal is at the logic-low state, and the transmission gate is turned on.

When transmission gate 236 is turned on, the inverted D signal from the output of inverter 234 is sampled by a back-to-back latch configuration of inverters 238 and 240. Here, the D signal is recovered at an output of inverter 238 (the output of master latch 230), and the inverted logic state of the D signal is provided at an output of inverter 240 to a transmission gate 242. Transmission gate 242 includes an n-MOS pass gate portion that is connected to the CPI signal, and a p-MOS pass gate portion that is connected to the CPN signal. When the CK signal is at a logic high state, transmission gate 242 is turned on, and when the CK signal is at a logic low state, the transmission gate is turned off. Thus, when transmission gate 236 is turned on, transmission gate 242 is turned off, and vice versa. As such, when transmission gate 236 is turned on and transmission gate 242 is turned off, the D signal is said to be sampled by the back-to-back latch, and when transmission gate 236 is turned off and transmission gate 242 is turned on, the D signal is said to be held at the output of inverter 238, and changes in the state of the D signal, as seen at the input of inverter 234 (the input of master latch 230), are isolated from the back-to-back latch until the next clock cycle, when the sample-and-hold cycle is repeated. Inverters 234, 238, and 240 all receive power from the high voltage power distribution network, and thus the respective outputs swing between VDDH 102 and ground.

Slave latch 250 operates to receive the master-latched D signal from the output of master latch 230 (the output of inverter 238), and to latch the state of the master-latched D signal at an output of the slave latch, until such time as the master-latched D signal changes logic state, at which time the slave latch latches to the new state. The output of slave latch 250 is referred to as a Q signal. In particular, the master-latched D signal is provided to an inverter 252 which provides an inverted Q signal, also referred to as the Q-bar signal, here shown as the Qb signal. The Qb signal is provided to a transmission gate 254. Transmission gate 254 includes an n-MOS pass gate portion that is connected to the CPN signal, and a p-MOS pass gate portion that is connected to the CPI signal. Thus, when the CK signal is at a logic high state, transmission gate 254 is turned on, and when the CK signal is at a logic low state, the transmission gate is turned off.

When transmission gate 254 is turned on, the Qb signal is passed to inverter 258 which inverts the Qb signal to provide the Q signal at an output of the inverter (the output of slave latch 250). The Qb signal is also provided to a series loop-back latch configuration of inverters 262 and 264, and the Qb signal is provided at an output to inverter 264 at pass gate 266. Pass gate 266 is an n-MOS pass gate that is connected to the CPNL signal. When the CK signal is at a logic high state, pass gate 266 is turned on, and when the CK signal is at a logic low state, the pass gate is turned off. Thus, when transmission gate 254 is turned on, pass gate 266 is turned off, and vice versa. As such, when transmission gate 254 is turned on and pass gate 266 is turned off, the Qb signal is said to be sampled by the series loop-back latch, and when transmission gate 254 is turned off and pass gate 266 is turned on the Qb signal is said to be held at the output of inverter 264, and changes in the state of the master-latched D signal, as seen at the input of inverter 252 (the input of slave latch 250), are isolated from the series loop-back latch until the next clock cycle, when the sample-and-hold cycle is repeated. Note that when transmission gate 236 is turned on, transmission gate 254 is turned off, and vice versa. Thus, when master latch 230 is operating to sample the D signal, slave latch 250 is operating to hold the previously latched information from the master latch, and when the master latch is operating to hold the D signal, the slave latch is operating to sample the D signal from the master latch.

Inverters 252 and 258 receive power from the high voltage power distribution network, and thus the respective outputs swing between VDDH 102 and ground. The loop-back latch inverters 262 and 264 receive power from the low voltage power distribution network, and thus the respective outputs swing between VDDL 104 and ground. Here, by powering inverters 262 and 264 via the low voltage power distribution network, the inverters consume less dynamic power and also consume less static power. This is because leakage current increases exponentially with voltage. As such, an exemplary flip-flop with loop-back latch inverters that are powered via a 0.7 V VDDL can exhibit 5-10% less power consumption as opposed to a similar flip-flop that powers loop-back latch inverters from a 1.1 V VDDH. Thus, a SoC device that instantiates a LSC tree can achieve additional power savings by instantiating flip-flops in the SoC device that include loop-back latch inverters that are powered from the same low voltage power distribution network as the LSC tree.

However, because the output of inverter 264 swings between VDDL 104 and ground, the Qb signal is provided with a pull-up to VDDH 102, via a p-MOS transistor 268 that is driven from the Q signal. Here, when the output of inverter 264 is set to a low logic state, the Qb signal is also in a low logic state, and inverter 258 provides the Q signal in a high logic state. In this case, transistor 268 is turned off, and the Qb signal remains at a low logic state. On the other hand, when the output of inverter 264 is set to a high logic state, the Qb signal is driven to VDDL 104, and inverter 258 provides a Q signal that is in a low logic state. Here, transistor 268 is turned on, and the Qb signal is pulled up to a high logic state at VDDH 102. The skilled artisan will recognize that the implementation of pull-up transistor 268 in slave latch 250 is optional. For example, in a slave latch similar to slave latch 250, but without a pull-up transistor, the rise time of the Qb signal can be slower than in slave latch 250. Moreover, the fact that inverter 264 only drives a voltage of VDDL 104 can result in additional leakage in inverter 258, or in timing delays in switching the output of inverter 258. As such, a pull-up transistor similar to pull-up transistor 268 can be included in a slave latch, as needed or desired.

Note that, in the critical path, referred to as the clock-to-Q timing, between the D signal input at inverter 234 and the Q signal output at inverter 258, inverters 234, 238, 252, and 258 are powered by VDDH 102, and transmission gates 236 and 254 are clocked by the CPN signal and the CPI signal that are provided by respective inverters 218 and 222 that are also powered by VDDH 102. As such, the clock-to-Q timing of flip-flop 200 is unaffected by the inclusion of loop-back latch inverters 262 and 264 that are powered by VDDL 104. Also note that, in terms of cell layout, flip-flop 200 only adds one inverter (i.e., inverter 226) over a flip-flop cell layout that does not include loop-back latch inverters that are powered by VDDL. In particular, although flip-flop 200 includes pull-up transistor 268, the flip-flop utilizes p-MOS pass gate 266 in place of the transmission gate normally associated with a flip-flop design. Moreover, because CPNL signal 228 is only provided to pass gate 266, inverter 226 can be sized to provide only one output (i.e., to pass gate 266). Further, because the CPN signal and the CPI signal are provided to three transmission gates, rather than to four transmission gates, as would be the case normally associated with a flip-flop design, inverters 218 and 222 can be smaller, as well.

Figure 3:
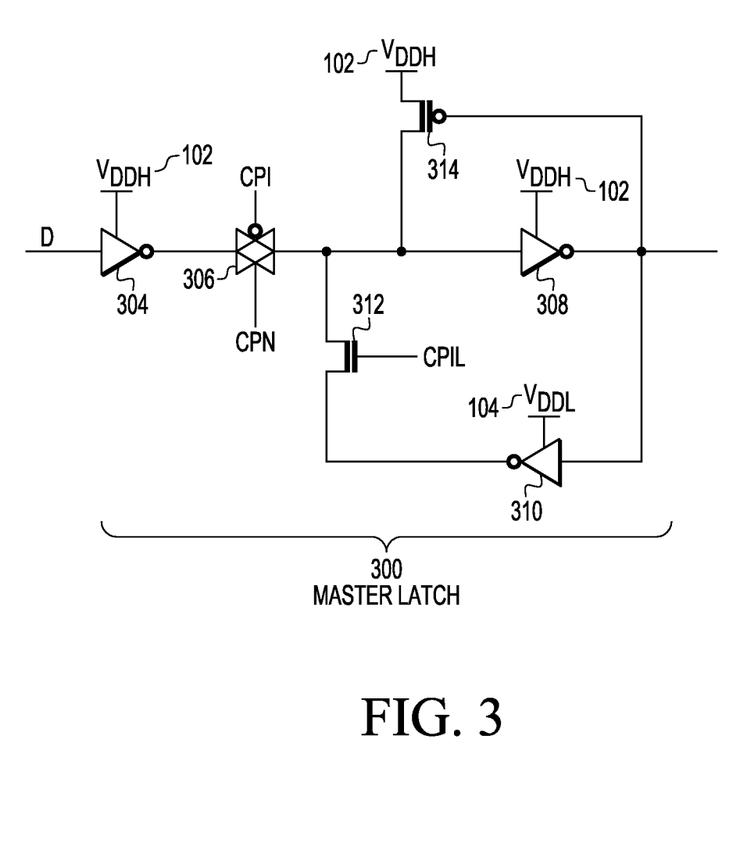
FIG. 3 illustrates a master latch, according to an embodiment of the present disclosure.

FIG. 3 illustrates a master latch 300 according to an embodiment of the present disclosure. Master latch 300 is a portion of a flip-flop similar to flip-flop 200, and the flip-flop includes a clock generator similar to clock generator 210, and a slave latch similar to slave latch 250. As such, master latch 300 operates similarly to master latch 230, to receive a D signal and to latch the state of the D signal until such time as the D signal changes to a second state, at which time the master latch latches to the second state. In particular, the D signal is provided to an inverter 304 which inverts the D signal. The inverted D signal is provided to a transmission gate 306. Transmission gate 306 includes an n-MOS pass gate portion that is connected to the CPN signal, and a p-MOS pass gate portion that is connected to the CPI signal. Thus, when the CK signal is at a logic high state (i.e., the CPN signal is low and the CPI signal is high), transmission gate 306 is turned off, and when the CK signal is at a logic low state (the CPN signal is high and the CPI signal is low), the transmission gate is turned on.

When transmission gate 306 is turned on, the inverted D signal from the output of inverter 304 is sampled by a back-to-back latch configuration of inverters 308 and 310. Here, the D signal is recovered at an output of inverter 308 (the output of master latch 300), and the inverted logic state of the D signal is provided at an output of inverter 310 to an n-MOS pass gate 312. Pass gate 312 is connected to a CPIL signal. Here, the CPIL signal is generated in the clock generator by inverting a CPNL signal similar to CPNL signal 228. In another embodiment, the CPIL signal can be derived from a CK signal similar to the CK signal. When the CK signal is at a logic high state pass gate 312 is turned on, and when the CK signal is at a logic low state, the pass gate is turned off. Thus, when transmission gate 306 is turned on, pass gate 312 is turned off, and vice versa. As such, when transmission gate 306 is turned on and pass gate 312 is turned off, the D signal is said to be sampled by the back-to-back latch, and when the transmission gate is turned off and the pass gate is turned on, the D signal is said to be held at the output of inverter 308, and changes in the state of the D signal, as seen at the input of inverter 304 (the input of master latch 300), are isolated from the back-to-back latch until the next clock cycle, when the sample-and-hold cycle is repeated. Inverters 304 and 308 receive power from VDDH 102, and thus the respective outputs swing between VDDH and ground.

Inverter 310 receives power from the low voltage power distribution network, and thus the output of inverter 310 swings between VDDL 104 and ground. Here, by powering inverter 310 via the low voltage power distribution network, the inverter consumes less dynamic power and also consumes less static power. However, because the output of inverter 310 swings between VDDL 104 and ground, the input at inverter 308 is provided with an additional pull-up to VDDH 102, via a p-MOS transistor 314 that is driven from output of inverter 308. Here, when inverter 310 is latched to a low logic state, inverter 308 provides a D signal that is in a high logic state, transistor 314 is turned off, and the low logic state at the input of inverter 308 remains at the low logic state. On the other hand, when inverter 310 is latched to a high logic state, inverter 308 provides a D signal that is in a low logic state, transistor 314 is turned on, and the high logic state Db signal is pulled up to a high logic state VDDH 102.

The skilled artisan will recognize that providing inverter 310 in master latch 300 will result in a decrease in the dynamic and static power consumed by the master latch. The skilled artisan will also recognize that providing inverter 310 in master latch 300 may adversely impact setup and hold times for the master latch. Thus, in a particular embodiment, master latch 300 is selected in a circuit of a SoC device as needed or desired to result in a lower power SoC device where setup and hold time is less critical. The skilled artisan will further recognize that flip-flop 200 and master latch 300 are exemplary of a wide variety of flip-flop designs and other circuit designs that can achieve beneficial power savings by powering one or more inverters in a SoC device via a low voltage power distribution network. The skilled artisan will recognize that the implementation of pull-up transistor 314 in master latch 300 is optional. For example, in a master latch similar to master latch 300, but without a pull-up transistor, the rise time of the inverted D signal can be slower than in master latch 230. As such, a pull-up transistor similar to pull-up transistor 314 can be included in a master latch, as needed or desired.

Figure 4:
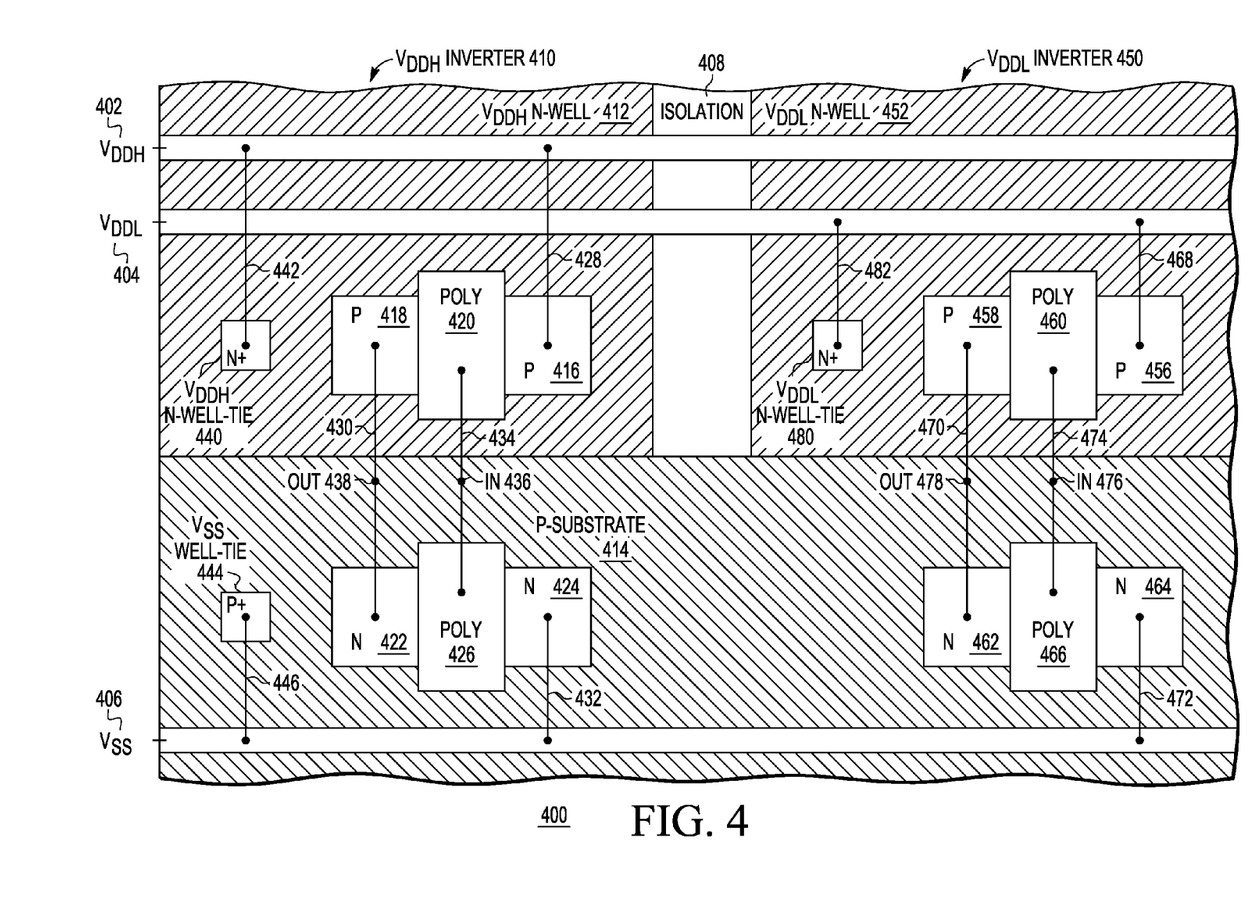
FIG. 4 illustrates a circuit layout, according to an embodiment of the present disclosure.

FIG. 4 illustrates a circuit layout 400 according to an embodiment of the present disclosure. Layout 400 includes a VDDH bus 402, a VDDL bus 404, a VSS (e.g., ground) bus 406, an isolation region 408, a VDDH inverter 410, and a VDDL inverter 450. VDDH inverter 410 is a CMOS inverter including a p-MOS transistor formed in a VDDH n-doped region, presumed to be p-well 412, and an n-MOS transistor formed in a p-doped region, presumed to be p-substrate 414. In particular, inverter 410 as formed at VDDH n-well 412 includes an active region comprising p-doped source/drain regions 416 and 418 and an n-doped channel region underlying a gate 420, and inverter 410 as formed at p-substrate 414 includes an active region comprising n-doped source/drain regions 422 and 424, and a p-doped channel region underlying a gate 426. Source/drain region 416 is connected via connection 428 to VDDH bus 402 and functions as the p-MOSFET source region. Source/Drain region 418 is connected via connection 430 to source/drain region 422. Here, source/drain region 418 functions as the p-MOSFET drain region and source/drain region 422 functions as the n-MOSFET drain region. Source/drain region 424 is connected via connection 432 to VSS bus 406 and functions as the n-MOSFET source region. Gates 420 and 426 are connected together via connection 434 and form an inverter input 436, and connection 430 forms an inverter output 438.

VDDL inverter 450 is a CMOS inverter including a p-MOS transistor formed in a VDDL n-well 452 and an n-MOS transistor formed in p-substrate 414. In particular, inverter 450 as formed at VDDL n-well 452 includes an active region comprising p-doped source/drain regions 456 and 458 and an n-doped channel region underlying a gate 460, and inverter 450 as formed at p-substrate 414 includes an active region comprising n-doped source/drain regions 462 and 464, and a p-doped channel region underlying a gate 466. Source/drain region 456 is connected via connection 468 to VDDL bus 404 and functions as the p-MOSFET source region. Source/Drain region 458 is connected via connection 470 to source/drain region 462. Here, source/drain region 458 functions as the p-MOSFET drain region and source/drain region 462 functions as the n-MOSFET drain region. Source/drain region 464 is connected via connection 472 to VSS bus 406 and functions as the n-MOSFET source region. Gates 460 and 466 are connected together via connection 474 and form an inverter input 476, and connection 470 forms an inverter output 478. In a particular embodiment, inverter 410 is associated with one of inverters 218, 222, 234, 238, 240, 252, or 258 of flip-flop 200, and inverter 450 is associated with one of inverters 226, 262, and 264 of the flip-flop. For example, where inverter 410 is associated with inverter 258, and inverter 450 is associated with inverter 262, then input 436 and input 476 would be connected together via an input connection (not illustrated).

VDDH n-well 412 includes a VDDH well-tie 440 that is connected via connection 442 to VDDH bus 402, p-substrate 414 includes a VSS well-tie 444 that is connected via connection 446 to VSS bus 406, and VDDL n-well 452 includes a VDDH well-tie 480 that is connected via connection 482 to VDDL bus 404. Thus VDDH inverter 410 and VDDL inverter 450 are each constructed on their own respective VDDH and VDDL n-wells 412 and 452. In particular, the VDDH n-well 412 is tied to power separately from VDDL n-well 452.

Figure 5:
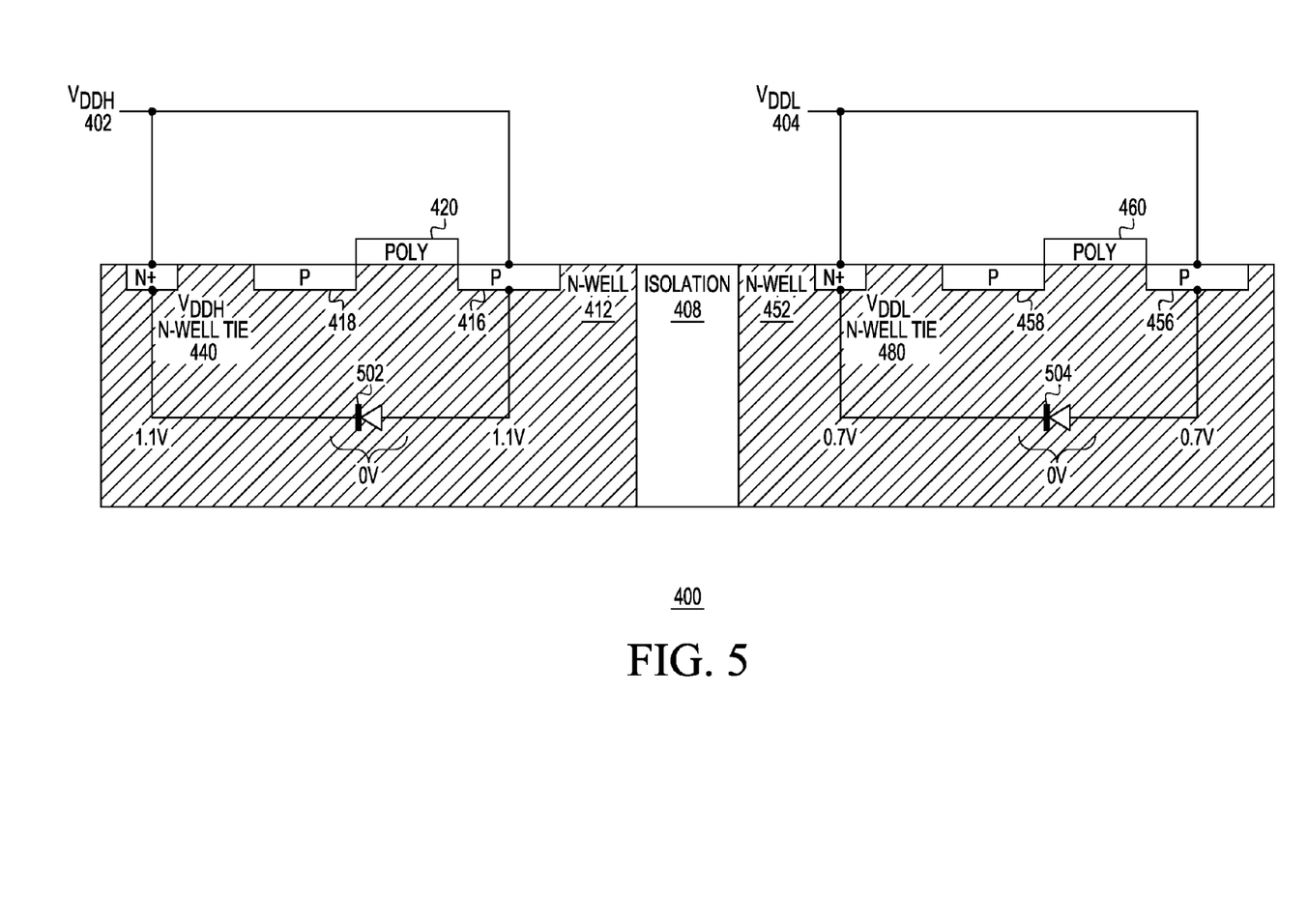
FIG. 5 is a cross-sectional view of a p-MOS portion of circuit layout of FIG. 4.

FIG. 5 is a cross-sectional view of a p-MOS portion of circuit layout 400, including isolation region 408, and VDDH and VDDL n-wells 412 and 452. VDDH n-well 412 includes source/drain regions 416 and 418, gate 420 and VDDH well-tie 440. Source/drain region 416 and VDDH n-well tie 440 are illustrated as connected to VDDH bus 402, and are illustrated as forming an effective p-n junction diode 502 between the p-doped source/drain region and the n+ doped VDDH well-tie. In the example where VDDH bus 402 provides 1.1 V, diode 502 is provided with a 0 V bias. Similarly, VDDL n-well 452 includes source/drain regions 456 and 458, gate 460 and VDDL well-tie 480. Source/drain region 456 and VDDL n-well tie 480 are illustrated as connected to VDDL bus 404, and are illustrated as forming an effective p-n junction diode 504 between the p-doped source/drain region and the n+ doped VDDL well-tie. In the example where VDDL bus 404 provides 0.7 V, diode 504 is provided with a 0 V bias.

Figure 6:
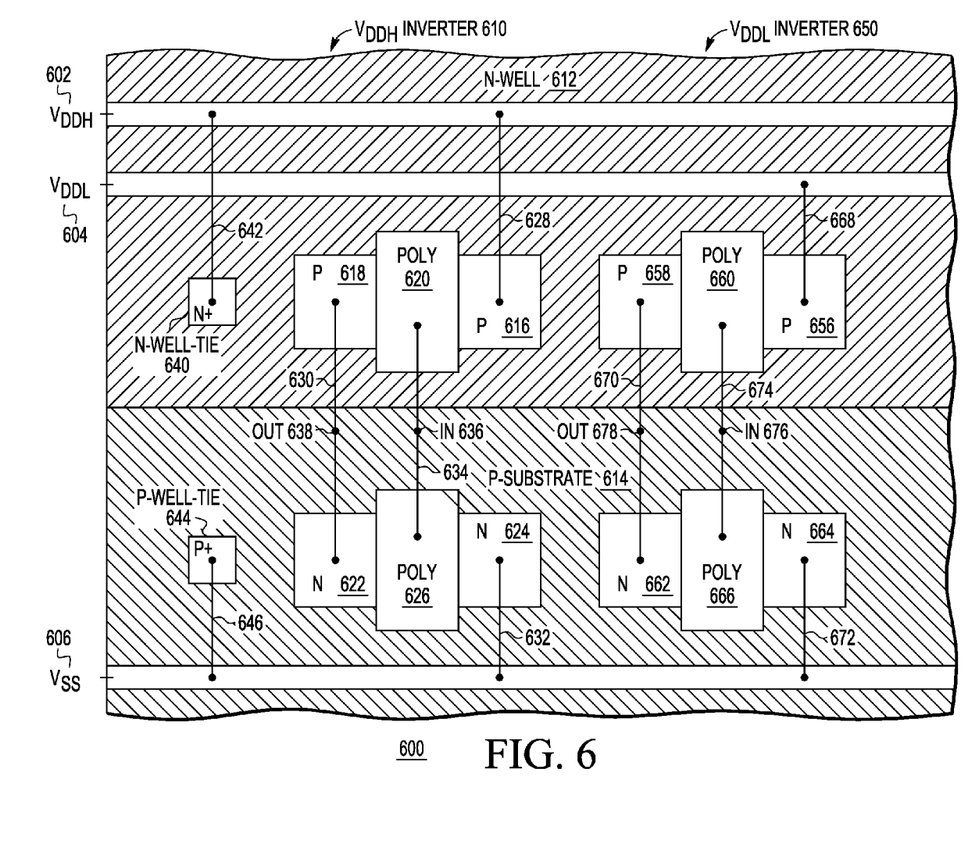
FIG. 6 illustrates a circuit layout, according to another embodiment of the present disclosure.

FIG. 6 illustrates a circuit layout 600 according to an embodiment of the present disclosure. Layout 600 includes a VDDH bus 602, a VDDL bus 604, a VSS (e.g., ground) bus 606, a VDDH inverter 610, and a VDDL inverter 650. VDDH inverter 610 is a CMOS inverter including a p-MOS transistor formed in an n-well 612 and an n-MOS transistor formed in a p-substrate 614. In particular, inverter 610 as formed at n-well 612 includes an active region comprising p-doped source/drain regions 616 and 618 and an n-doped channel region underlying a gate 620, and inverter 610 as formed at p-substrate 614 includes an active region comprising n-doped source/drain regions 622 and 624, and a p-doped channel region underlying a gate 626. Source/drain region 616 is connected via connection 628 to VDDH bus 602 and functions as the p-MOSFET source region. Source/Drain region 618 is connected via connection 630 to source/drain region 622. Here, source/drain region 618 functions as the p-MOSFET drain region and source/drain region 622 functions as the n-MOSFET drain region. Source/drain region 624 is connected via connection 632 to VSS bus 606 and functions as the n-MOSFET source region. Gates 620 and 626 are connected together via connection 634 and form an inverter input 636, and connection 630 forms an inverter output 638.

VDDL inverter 650 is a CMOS inverter including a p-MOS transistor formed in n-well 612 and an n-MOS transistor formed in a p-substrate 614. In particular, inverter 650 as formed at n-well 612 includes an active region comprising p-doped source/drain regions 656 and 658 and an n-doped channel region underlying a gate 660, and inverter 650 as formed at p-substrate 614 includes an active region comprising n-doped source/drain regions 662 and 664, and a p-doped channel region underlying a gate 666. Source/drain region 656 is connected via connection 668 to VDDL bus 604 and functions as the p-MOSFET source region. Source/Drain region 658 is connected via connection 670 to source/drain region 662. Here, source/drain region 658 functions as the p-MOSFET drain region and source/drain region 662 functions as the n-MOSFET drain region. Source/drain region 664 is connected via connection 672 to VSS bus 606 and functions as the n-MOSFET source region. Gates 660 and 666 are connected together via connection 674 and form an inverter input 676, and connection 670 forms an inverter output 678. In a particular embodiment, inverter 410 is associated with one of inverters 304 or 308 of master latch 300, and inverter 650 is associated with inverter 310 of the master latch. For example, where inverter 610 is associated with inverter 308 and inverter 650 is associated with inverter 310, then output 638 and input 676 would be connected together via an input connection (not illustrated). N-well 612 includes a VDDH well-tie 640 that is connected via connection 642 to VDDH bus 602, and p-substrate 614 includes a VSS well-tie 644 that is connected via connection 646 to VSS bus 606.

Figure 7:
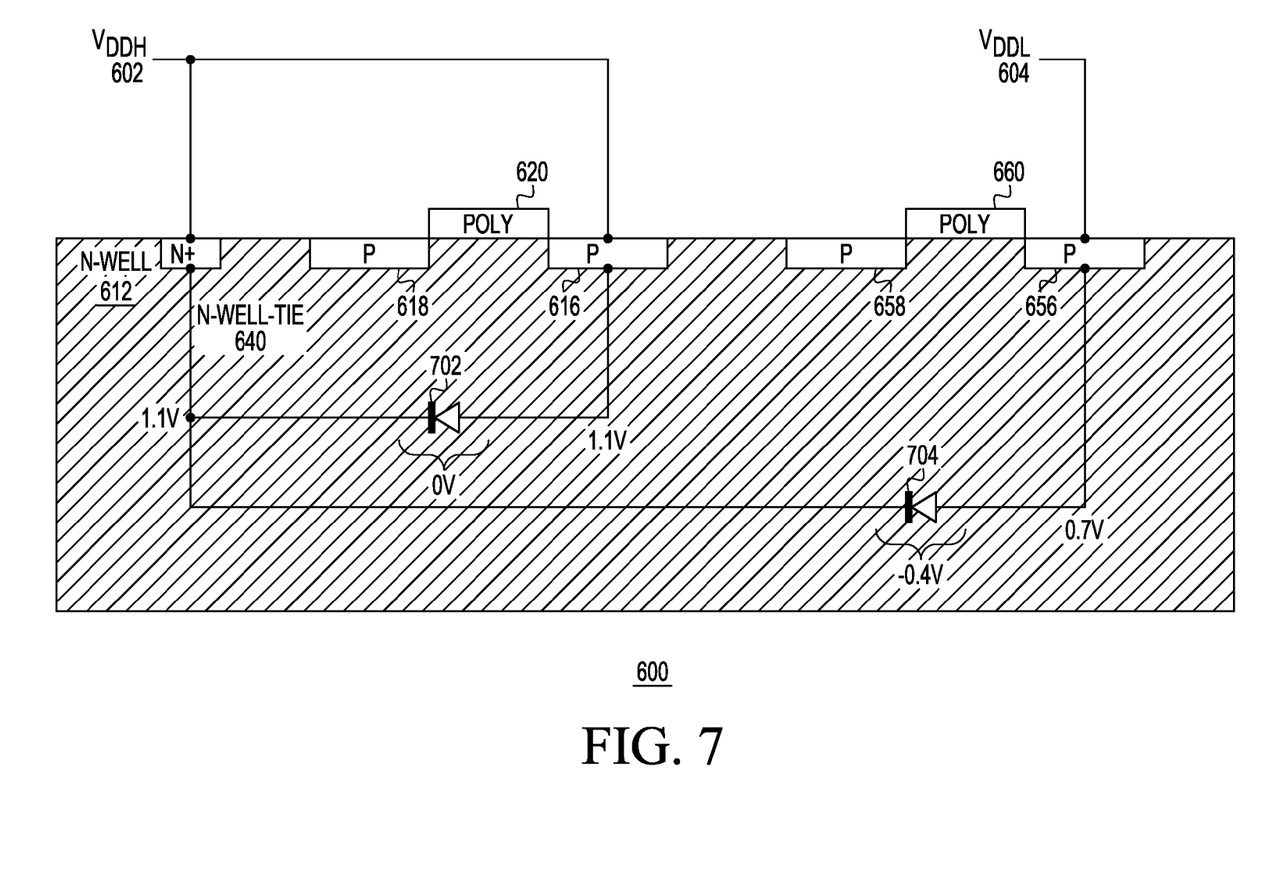
FIG. 7 is a cross-sectional view of a p-MOS portion of circuit layout FIG. 6.

FIG. 7 is a cross-sectional view of a p-MOS portion of circuit layout 600, including n-well 612. N-well 612 includes source/drain regions 616 and 618, gate 620 and VDDH well-tie 640. Source/drain region 616 and VDDH n-well tie 640 are illustrated as connected to VDDH bus 602, and are illustrated as forming an effective p-n junction diode 702 between the p-doped source/drain region and the n+ doped VDDH well-tie. In the example where VDDH bus 602 provides 1.1 V, diode 702 is provided with a 0 V bias. N-well 612 also includes source/drain regions 656 and 658 and gate 660. Source/drain region 656 is illustrated as being connected to VDDL bus 604, and is illustrated as forming an effective p-n junction diode 504 between the p-doped source/drain region and the n+ doped VDDH well-tie 640. In the example where VDDL bus 604 provides 0.7 V, diode 704 is provided with a –0.4 V bias.

In a particular embodiment, a data processing system includes a first power distribution network to provide power at a first voltage level, a second power distribution network to provide power at a second voltage level, wherein the second voltage level is less than the first voltage level, and a flip-flop. The flip-flop includes a master latch coupled to the first power distribution network, and a slave latch coupled to the second power distribution network. The master latch receives a data signal, latches the data signal, and provides a master latch output signal that swings between a ground voltage level and the first voltage level. The slave latch receives the master latch output signal, latches the master latch output signal, and provides a slave latch output signal that swings between the ground voltage level and the first voltage level. The slave latch includes a first latch inverter to receive the master latch output signal and provide a first latch inverter output signal that swings between the ground voltage level and the second voltage level.

Specific implementations of the data processing system can include: where the slave latch can further include a second latch inverter to receive the first latch inverter output signal and provide a second latch inverter output signal that swings between the ground voltage level and the second voltage level, where the first latch inverter and the second latch inverter latch the master latch output signal; where the data processing system can further include a clock tree to provide a low-swing clock signal that swings between the ground voltage level and the second voltage level, and a local clock generator to receive the low-swing clock signal and provide an internal clock signal that swings between the ground voltage level and the first voltage level, a first negated clock signal that swings between the ground voltage level and the first voltage level, and a second negated clock signal that swings between the ground voltage level and the second voltage level, where the internal clock signal, the first negated clock signal, and the second negated clock signal are based on the low-swing clock signal; where the slave latch can further include a first transmission gate to receive the internal clock signal and the first negated clock signal and to gate the master latch output signal to the slave latch; and where the slave latch can further include a pass gate to receive the second negated clock signal and to hold the second latch inverter output signal when the first transmission gate is not gating the master latch output signal to the slave latch.

Another specific implementation of the data processing system can include where the slave latch can further include an output inverter to receive the master latch output signal and provide a slave latch output signal, and a pull-up transistor to receive the slave latch output signal and, in response to the slave latch output signal being at a low state, to pull the master latch output signal to the first voltage level.

Other specific implementations of the data processing system can include: where the master latch can include a second latch inverter to receive the master latch output signal and provide a second latch inverter output signal that swings between the ground voltage level and the second voltage level; where the master latch further includes a second transmission gate to receive an internal clock signal and a first negated clock signal and to gate the data signal to the master latch, wherein the internal clock signal and the first negated clock signal each swing between the ground voltage level and the first voltage level; where the master latch further includes a pass gate to receive a second internal clock signal and to hold the second latch inverter output signal when the second transmission gate is not gating the data signal to the master latch; and where the master latch further includes an output inverter to receive the data signal and provide the master latch output signal, and a pull-up transistor to receive the master latch output signal and, in response to the master latch output signal being at a low state, to pull the data signal to the first voltage level.

In another embodiment, a method includes receiving a data signal at a master latch of a flip-flop, wherein the master latch is coupled to a first power distribution network that provides a first voltage level, latching, at the master latch, the data signal, providing a master latch output signal that swings between a ground voltage level and the first voltage level, receiving the master latch output signal at a slave latch of the flip-flop, latching, at the slave latch, the master latch output signal, providing a slave latch output signal that swings between the ground voltage level and the first voltage level, receiving, at a first latch inverter of the slave latch, the master latch output signal, wherein the first latch inverter is coupled to a second power distribution network that provides a second voltage level, and providing, from the first latch inverter, a first latch inverter output signal that swings between the ground voltage level and the second voltage level.

Specific implementations of the method can include: receiving, at a second latch inverter of the slave latch, the first latch inverter output signal, wherein the second latch inverter is coupled to the second power distribution network, and providing, from the second latch inverter, a second latch inverter output signal that swings between the ground voltage level and the second voltage level; providing, by a clock tree, a low-swing clock signal that swings between the ground voltage level and the second voltage level, receiving, by a local clock generator, the low-swing clock signal, providing, by the local clock generator, an internal clock signal that swings between the ground voltage level and the first voltage level, providing, by the local clock generator, a first negated clock signal that swings between the ground voltage level and the first voltage level, and providing, by the local clock generator, a second negated clock signal that swings between the ground voltage level and the second voltage level, where the internal clock signal, the first negated clock signal, and the second negated clock signal are based on the low-swing clock signal; receiving, at a first transmission gate of the slave latch, the internal clock signal and the first negated clock signal, and gating, by the first transmission gate, the master latch output signal to the slave latch; and receiving, at a pass gate of the slave latch, the second negated clock signal, and holding, by the pass gate, the second latch inverter output signal when the first transmission gate is not gating the master latch output signal to the slave latch.

Another specific implementation of the method can include receiving, at an output inverter of the slave latch, the master latch output signal, providing, at the output inverter, a slave latch output signal, receiving, at a pull-up transistor of the slave latch, the slave latch output signal, and pulling, by the pull-up transistor, the master latch output signal to the first voltage level in response to the slave latch output signal being at a low state.

Other specific implementations of the method can include: receiving, at a second latch inverter of the master latch, the master latch output signal, and providing, by the second latch inverter, a second latch inverter output signal that swings between the ground voltage level and the second voltage level; receiving, at a second transmission gate of the master latch, an internal clock signal and a first negated clock signal, wherein the internal clock signal and the first negated clock signal each swing between the ground voltage level and the first voltage level, gating, by the second transmission gate, the data signal to the master latch, receiving, at a second pass gate of the master latch, a second internal clock signal, and holding, at the second pass gate, the second latch inverter output signal when the second transmission gate is not gating the data signal to the master latch; and receiving, at an output inverter the master latch, the data signal, providing, by the output inverter, the master latch output signal, receiving, at a pull-up transistor of the master latch, the master latch output signal, and pulling, by the pull-up transistor, the master latch output signal to the first voltage level in response to the master latch output signal being at a low state.

In another embodiment, a flip-flop includes a master latch to receive a data signal, latch the data signal, and provide a master latch output signal, wherein the master latch is coupled to a first power distribution network that provides a first voltage level, and wherein the master latch output signal that swings between a ground voltage level and the first voltage level, and a slave latch to receive the master latch output signal, latch the master latch output signal, and provide a flip-flop output signal, wherein the output signal swings between a ground voltage level and the first voltage level, where the slave latch further comprises a latch inverter to receive the master latch output signal and provide a first latch inverter output signal that swings between the ground voltage level and a second voltage level, wherein the second voltage level is less than the first voltage level.

Based upon the description herein, it will be appreciated that the preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A data processing system comprising:
   a first power distribution network to provide power at a first voltage level;
   a second power distribution network to provide power at a second voltage level, wherein, relative to a reference voltage level, the second voltage level is less than the first voltage level; and
   a flip-flop comprising:
      a master latch including:
         a first power node connected to the first power distribution network;
         an input node to receive a data signal to be latched; and
         an output node coupled to the first power distribution network to provide a master latch output signal that is driven by the first power distribution network; and
      a slave latch comprising:

a first power node connected to the first power distribution network;
a second power node connected to the second power distribution network;
an output node to provide a slave latch output signal that is driven by the first power distribution network; and
a feedback circuit comprising a first slave latch inverter connected to the second power node of the slave latch, including an input node coupled to the output of the master latch, and an output node to provide a first slave latch inverter output signal that is driven by the second power distribution network.

2. The data processing system of claim 1, the feedback circuit further comprising:
a second slave latch inverter connected to the second power node of the slave latch, including an input node coupled to the output node of the first inverter, and an output node coupled to the input node of the first inverter to provide a second slave latch inverter output signal that is driven by the second power distribution network.

3. The data processing system of claim 2, the slave latch further comprising:
a pass gate including a control terminal to receive a low-swing clock signal that is driven by the second power distribution network, a first data terminal coupled to the output node of the second slave latch inverter, and a second data terminal coupled to the input node of the first slave latch inverter.

4. The data processing system of claim 2, the slave latch further comprising:
a pull-up transistor including a control terminal, a first data terminal connected to the first power node of the slave latch, and a second data terminal coupled to the output node of the second slave latch inverter.

5. The data processing system of claim 4, wherein the output node of the slave latch is an output node of an inverter having a power node connected to the first power node of the slave latch, an input node coupled to the second data terminal of the pull-up transistor, and an output node coupled to the control terminal of the pull-up transistor.

6. The data processing system of claim 2, further comprising:
a clock distribution network to provide a low-swing clock signal that is driven by the second power distribution network; and
a local clock generator including an input node to receive the low-swing clock signal, a first output node to provide a first clock signal that is driven by the first power distribution network, a second output node to provide a first negated clock signal that is driven by the first power distribution network, and a third output node to provide a second negated clock signal that is driven by the second power distribution network, wherein the first clock signal, the first negated clock signal, and the second negated clock signal are based on the low-swing clock signal.

7. The data processing system of claim 6, the slave latch further comprising:
a transmission gate including a first control terminal coupled to the first output node of the local clock generator, a second control terminal coupled to the second output node of the local clock generator, a first data terminal coupled to the output node of the master latch, and a second data terminal coupled to the input node of the first slave latch inverter to provide the master latch output signal to the first slave latch inverter.

8. The data processing system of claim 6, the master latch further comprising:
a second power node connected to the second power distribution network; and
a master feedback circuit comprising a master latch inverter connected to the second power node of the master latch, an input node coupled to the input node of the master latch, and an output node to provide a master latch inverter output signal that is driven by the second power distribution network.

9. The data processing system of claim 8, wherein:
the local clock generator, includes a fourth output node to provide a second clock signal that is driven by the second power distribution network, wherein the second clock signal is based on the low-swing clock signal; and
the master latch further comprises:
a pass gate including a control terminal coupled to the fourth output node of the local clock generator, a first data terminal coupled to the output node of the master latch inverter, and a second data terminal to provide the master latch inverter output signal to the master latch.

10. The data processing system of claim 8, the master latch further comprising:
a master output inverter connected to the first power node of the master latch, an input node coupled to the input node of the master latch, and an output node to provide the master latch output signal; and
a pull-up transistor having an input terminal connected to the first power node of the master latch, a control terminal coupled to the output node of the master output inverter, and an output terminal coupled to the output node of the master latch inverter.

11. A method comprising:
receiving, at a master latch of a flip-flop, a master latch output signal at a slave latch of the flip-flop, wherein the master latch is coupled to a first power distribution network that provides a first voltage level;
receiving, at a first latch inverter of a feedback loop of the slave latch, the master latch output signal, wherein the first latch inverter is coupled to a second power distribution network that provides a second voltage level wherein, relative to a reference voltage level, the second voltage level is less than the first voltage level;
providing, from the first latch inverter, a first latch inverter output signal that is driven by the second power distribution network; and
providing a slave latch output signal, based on a first latch inverter output signal, that is driven by the first power distribution network.

12. The method of claim 11, further comprising:
receiving, at a second latch inverter of the slave latch, the first latch inverter output signal, wherein the second latch inverter is coupled to the second power distribution network; and
providing, from the second latch inverter, a second latch inverter output signal that is driven by the second power distribution network.

13. The method of claim 11, further comprising:
receiving, at an output inverter of the slave latch, the master latch output signal;
providing, at the output inverter, a slave latch output signal;
receiving, at a control terminal of a pull-up transistor of the slave latch, the slave latch output signal; and
driving, by the pull-up transistor, the slave latch output signal to the first voltage level in response to the slave latch output signal being at a low state.

14. The method of claim 11, further comprising:
receiving a data signal at the master latch;
latching, at the master latch, the data signal;
providing the master latch output signal that is driven by the first power distribution network;
receiving, at a second latch inverter of the master latch, the master latch output signal; and
providing, by the second latch inverter, a second latch inverter output signal that is driven by the second power distribution network.

15. The method of claim 14, further comprising:
receiving, at a transmission gate of the master latch, a clock signal and a first negated clock signal, wherein the clock signal and the first negated clock signal are each driven by the first power distribution network;
gating, by the transmission gate, the data signal to the master latch;
receiving, at a pass gate of the master latch, a second clock signal, wherein the second clock signal is driven by the second power distribution network; and
providing, by the pass gate, the second latch inverter output signal when the transmission gate is not providing the data signal to the master latch inverter.

16. The of claim 14, further comprising:
providing, by a master output inverter connected to the first power node of the master latch, the master latch output signal; and
receiving, at a pull-up transistor of the master latch, the master latch output signal; and
pulling, by the pull-up transistor, the second latch inverter output signal to the first voltage level in response to the master latch output signal being at a low state.

17. The method of claim 12, further comprising:
providing, by a clock tree distribution network, a low-swing clock signal that is driven by the second power distribution network;
providing, by a local clock generator of the clock tree distribution network, a first clock signal that is driven by the first power distribution network, a first negated clock signal that is driven by the first power distribution network, a second clock signal that is driven by the second power distribution network, and a second negated clock signal that is driven by the second power distribution network, wherein the first clock signal, the first negated clock signal, the second clock signal, and the second negated clock signal are based on the low-swing clock signal receiving, at a transmission gate of the slave latch, the first clock signal and the first negated clock signal; and
gating, by the transmission gate, the master latch output signal provided to the slave latch.

18. The method of claim 17, further comprising:
receiving, at a pass gate of the slave latch, the second negated clock signal; and
providing, by the pass gate, the second latch inverter output signal to the first latch inverter.

19. A flip-flop comprising:
a master latch comprising:
    a power node connected to a first power distribution network;
    an input node to receive a data signal to be latched; and
    an output node to provide a master latch output signal that is driven by the first power distribution network; and
a slave latch comprising:
    a first power node connected to the first power distribution network;
    a second power node connected to a second power distribution network, wherein, relative to a reference voltage level, the second voltage level is less than the first voltage level;
    an input node coupled to the output of the master latch;
    an output node to provide a slave latch output signal that is driven by the first power distribution network; and
    a feedback circuit comprising a slave latch inverter connected to the second power node of the slave latch, including an input terminal coupled to the output of the master latch, and an output terminal to provide a slave latch inverter output signal that is driven by the second power distribution network.

20. The flip-flop of claim 19, the feedback circuit further comprising:
a pull-up transistor including a control terminal coupled to the output node of the slave latch, a first data terminal connected to the first power node of the slave latch, and a second data terminal coupled to the output node of the slave latch inverter; and
a pass gate including a control terminal to receive a low-swing clock signal that is driven by the second power distribution network, a first data terminal coupled to the output node of the slave latch inverter, and a second data terminal coupled to the input node of the slave latch inverter.

* * * * *